United States Patent [19]

Marino

[11] 3,993,383

[45] Nov. 23, 1976

[54] PRINTED CIRCUIT ELECTRICAL CONNECTORS

[76] Inventor: Vincent Marino, 7 Jacqueline Court, Port Jefferson Station, N.Y. 11776

[22] Filed: June 2, 1975

[21] Appl. No.: 583,191

[52] U.S. Cl. ............................ 339/17 L; 339/256 R

[51] Int. Cl.² ............................................ H05K 1/07

[58] Field of Search ......... 339/17 L, 17 LC, 17 LM, 339/17 M, 256 R

[56] References Cited

UNITED STATES PATENTS

| | | | |
|---|---|---|---|
| 3,066,367 | 12/1962 | Garman | 339/17 M X |
| 3,140,907 | 7/1964 | Davies | 339/17 L |
| 3,479,634 | 11/1969 | Pritulsky | 339/176 MP X |
| 3,790,916 | 2/1974 | Keitel | 339/17 L X |
| 3,864,007 | 2/1975 | Plyler et al. | 339/17 LC |
| 3,902,776 | 9/1975 | Williams et al. | 339/17 LM X |
| 3,922,051 | 11/1975 | Reynolds | 339/17 L |
| 3,924,918 | 12/1975 | Friend | 339/17 M |

*Primary Examiner*—Gerald A. Dost
*Attorney, Agent, or Firm*—Bauer, Amer & King

[57] ABSTRACT

Improved three-contact type electrical connectors, particularly advantageously used in establishing multiple electrical connection with a printed circuit board, in which the same, following their die stamped manufacture, are physically associated with a carrier or strip tab which greatly facilitates their handling and positioning preparatory to electrical connection to said printed circuit board. Further, the centrally located of the three contacts, which contains circuit-completing means thereon, and the strip tab, which contains positioning indicia, are maintained in the same plane as the construction material from which both are die stamped, so that the registry provided between each circuit-completing means and its cooperating positioning indicia is not disturbed, as might be the case if this contact, like the other two contacts, was required to be bent and shaped to properly accommodate the printed circuit board.

4 Claims, 6 Drawing Figures

PRINTED CIRCUIT ELECTRICAL CONNECTORS

The present invention relates generally to improved printed circuit board electrical connectors, and more particularly to improvements for the three-contact type, usually fabricated by being die stampled from planar or flat construction material, such as copper strips or the like.

It is already well known in the patent literature, as exemplified by U.S. Pat. Nos. 3,864,007, 3,404,290 and 3,479,634, that side-by-side electrical connectors can be die stamped in an initially physically associated relation with a carrier or strip tab. As needed, each connector is removed, one at a time, from the strip tab and positioned for electrical connection with the printed circuit board. Apart from the limited use noted of serving as an interconnecting member for plural electrical connectors, a prior art strip tab has little contribution to the advantageous use thereof, particularly as regards the positioning of the connectors on the printed circuit board.

Broadly, it is an object of the present invention to provide an improved electrical connector-strip tab arrangement overcoming the foregoing and other shortcomings of the prior art. Specifically, it is an object to use the physical association of the connectors along the strip tab to insure accurate positioning of the connectors, in any select number, in relation to electrical contacts of the printed circuitry with which electrical connections are established by the connectors.

Improved strip tab-connected printed circuit electrical connectors demonstrating objects and advantages of the present invention each are of the three contact type, in which two of its three contacts are detached from the strip tab and bent out of the plane thereof, and its third contact is detachably connected to the strip tab and more important, lies in the same plane as the strip tab. This third contact has a circuit-completing means thereon in an aligning relation with a cooperating positioning indicia on the strip tab, whereby the strip tab facilitates the positioning of multiples of the electrical connectors and also contributes to the accuracy thereof because of the registry which exists between the circuit-completing means and the positioning indicia.

The above brief description, as well as further objects, features and advantages of the present invention, will be more fully appreciated by reference to the following detailed description of a presently preferred, but nonetheless illustrative embodiment in accordance with the present invention, when taken in conjuction with the accompanying drawings, wherein.

Figure 1:
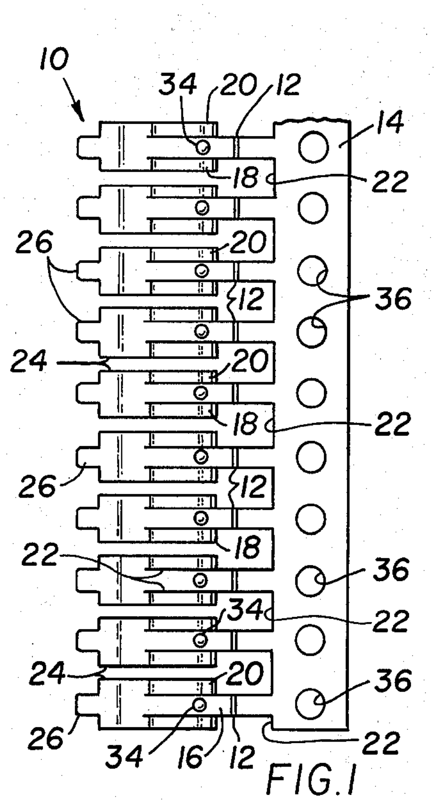
FIG. 1 is a plan view of plural electrical connectors arranged side-by-side in attached relation to a strip tab.
Figure 2:
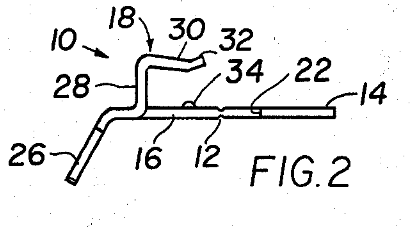
FIG. 2 is a side elevational view projected from FIG. 1 illustrating further structural features.
Figure 4:
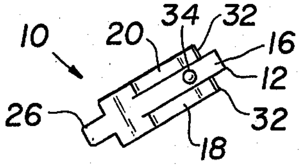
FIG. 4 is a plan view of an electrical connector hereof detached from the strip tab.

Reference is now made to the drawings, and in particular to FIGS. 1 and 2, wherein there is shown a side-by-side arrangement of electrical connectors demonstrating objects and advantages of the present invention, individually and collectively designated 10. The electrical connectors 10 are depicted in FIGS. 1, 2 in a favorable condition in which they are available just following their manufacture. That is, each connector 10 remains physically associated, as at a connection juncture 12, with an elongated planar strip tab 14. In this regard, one of the contributions of the present invention is the recognition that the metal electrical connector 10 hereof is most economically fabricated by being stamped or die-cut from planar construction material, and that this manufacturing process can be advantageously used to produce the connectors 10 in a physically attached condition to an elongated strip tab 14, the latter also being die stamped from the construction material. As a consequence, and as will be explained in greater detail subsequently, the handling of a plurality of the electrical connectors 10 is greatly facilitated since it requires moving or otherwise handling only the strip tab 14 on which the connectors are attached. In fact, the strip tab 14 functions as a handle for the plurality of electrical connectors 10 extending from said tab. Also, as should be obvious, any number of connectors 10 can be selected merely by the selection of a corresponding length of strip tab 14. The advantages just mentioned are just a few of those resulting from the die stamping of the electrical connectors 10 in physically associated or connected relation to the strip tab 14.

Referring specifically to FIGS. 1 and 2, it is to be noted that each connector 10 is of the three-contact variety. That is, it is comprised of the centrally located electrical contact 16 and a cooperating pair of right and left contacts 18 and 20, respectively. Only the central contact 16, as clearly shown in FIG. 2, lies in the plane of the strip tab 14 and furthermore constitutes the structure which is physically associated with the strip tab 14, having the connection juncture 12 formed therein. In a preferred embodiment, juncture 12 consists merely of a reduced cross-sectional thickness in the body of the central contact 16 and may take any form of weakened construction to facilitate the simple and rapid separation of the contact 16 from the tab 14.

In accordance with conventional die-stamping techniques, in order to produce an arrangement of connectors 10 along the strip tab 14 a solid strip of metal is fed to the die-stamping or work station, and at said work station the outline periphery of the two side contacts 18 and 20 are delineated in the strip material. Using the lowermost connector 10 in FIG. 1 as an example, this delineation will consist of producing a die-cut separation in the strip material in the length portions and at the locations collectively designated 22. In addition, the dies will produce cuts, as at the locations 24, resulting in the removal of a thin strip of metal between adjacent connectors 10. Also the die-cutting will remove appropriate material to provide the shoulders and the shape of a mounting tab 26 for each of the connectors 10. To return again, however, to the die-cuts 22, following the application of same to the strip material of construction, it will be understood that the side contacts 18 and 20 are then bent out of the plane of the material of construction, as illustrated in FIG. 2. When thusly bent, as illustrated specifically in connection with contact 18, the same possesses a generally vertically oriented length portion 28, a horizontally oriented length portion 30, and an outwardly flared tip 32.

In accordance with the present invention, the initial physical association of the strip tab 14 with the gang or side-by-side arrangement of connectors 10 is advantageously utilized to facilitate the positioning thereof, as already indicated, and also to insure accuracy during the positioning of the connectors 10 and the establishment of an electrical connection of these connectors 10 with the circuits printed on a board or other substrate. To this end, the structure of the combination which lies in the same plane, namely the central contact 16 and the strip tab 14 each respectively are provided with circuit-completing means and positioning indicia which are in registry with each other and which, as a consequence of this registry, contribute to the accurate positioning of the connectors 10, as will soon become apparent. In the illustrated embodiment, the circuit-completing means of each connector 10 consists of a dimple-shape 34, whereas the positioning indicia of the strip tab 14 consists of a die-cut opening 36. As clearly illustrated in FIG. 1, each cooperating dimple 34 and positioning opening 36 are provided in an aligning relationship with each other. As a consequence, when positioning plural electrical connectors 10 in relation to a printed circuit board, the user need only accurately locate on the board the uniformly provided positioning openings or indicia 36 and, in so doing, will automatically achieve a corresponding positioning of each of the circuit-completing dimples 34.

Figure 3:
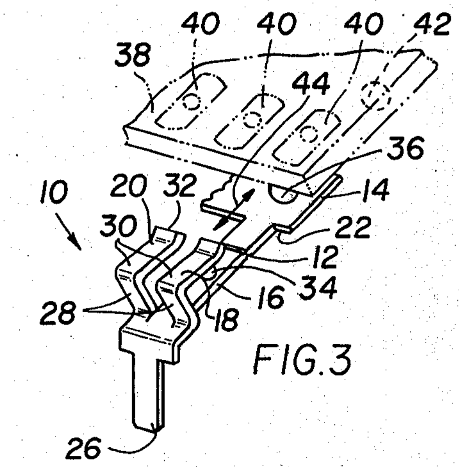
FIG. 3 illustrates how an electrical connection is established between the electrical connectors of FIGS. 1 and 2 and a printed circuit board.

The aforesaid is perhaps best illustrated in connection with FIG. 3, to which attention is now directed. It is to be assumed that the circuit board 38 is prepared, in a manner which is well understood, for electrical connection with a plurality of electrical connectors 10 (only one of which, for simplicity sake, is shown in FIG. 3) by the provision of contact recesses 40, the purpose and function of which will soon be apparent, and also by positioning indicia 42. Indicia 42 may take the form of markings on the printed circuit board 38 with which the openings 36 of the strip tab 14 are aligned when the plural connectors 10 are urged through positioning movement 44 about the contact end of the printed circuit board 38.

Figure 5:
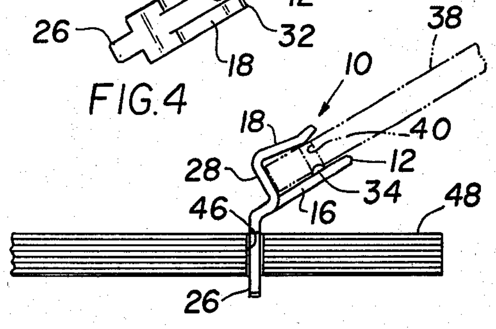
FIG. 5 is a side elevational view of the electrical connector and printed circuit board showing further structural details.
Figure 6:
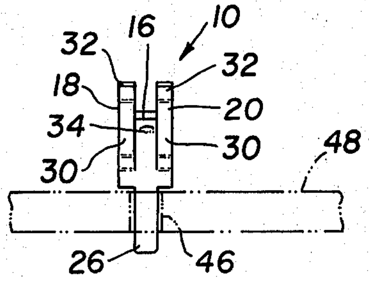
FIG. 6 is a front elevational view projected from FIG. 5.

As is perhaps best shown in FIG. 5, proper electrical connection of each connector 10 to the printed circuit board 38 is established when the dimple 34 thereof snaps into position with a cooperating recess 40. Depending upon the requirements for the electrical connection, the same may be reinforced by solder, or it may be sufficient to rely on the frictional engagement which is provided by the central contact 16 being located on one side of the printed circuit board 38 and the other two contacts 18 and 20 on the opposite side thereof. To this end, it will be understood that the connectors 10 are fabricated of copper which is a springy material, so that with an opening between the contacts 18, 20 and contact 16 sized slightly less than the board 38, which is to be understood to be the case, the three contacts 16, 18 and 20 frictionally engage the board 38 projected therebetween. As further shown in FIG. 5, after positioning of the connectors 10 in relation to the printed circuit board 38, the strip tab 14 is removed by detaching it along the weakened body sections or connection junctures 12. As is also shown in FIG. 5, the mounting tabs 26 of the connectors 10, which extend from the side opposite those of the contacts, are advantageously used for mounting purposes by each being projected through a cooperating opening 46 in a support body 48. In a conventional and well understood manner, an electrical connection is establised via the tabs 26.

From the foregoing it should be readily appreciated that there has been described herein a noteworthy construction for an electrical connector, the use of which with other side-by-side connectors is greatly facilitated because it is detachably connected to a strip tab 14. While it is already well known in the patent literature, as exemplified by U.S. Pat. Nos. 3,864,007, 3,404,290, and 3,479,634, that it is possible to die stamp three-contact connectors in attached relation to a carrier or strip tab, said prior art strip tab is attached to the connectors along the rear of the connectors, or what is herein referred to as the mounting tabs 26. All three contacts of the prior art connectors are then bent out of the plane of the strip tab in order to provide an opening between the contacts within which to project the printed circuit board. The movement in these prior art contacts of what is the equivalent of the within central contact 16 severely interferes with maintaining the registry between the circuit-completing means thereon and any positioning indicia which may be provided on the strip tab. Thus, in marked contrast to these prior art connectors, the within connector possesses noteworthy attributes insofar as each central contact 16 is maintained in the same plane as the strip tab 14 and the initial physical association of the connectors with the strip tab is maintained via said central contact 16. As indicated, among other noteworthy features, this results in accurate registry between the positioning indicia 36 in the strip tab 14 and the circuit-completing means 34 on the contact 16, which would not be the case if the contacts 16 and strip tab 14 were in different planes.

A latitude of modification, change and substitution is intended in the foregoing disclosure and in some instances some features of the invention will be employed without a corresponding use of other features. Accordingly, it is appropriate that the appended claims be construed broadly and in a manner consistent with the spirit and scope of the invention herein.

What is claimed is:

1. Improved printed circuit electrical connectors comprising, in combination, an elongated planar strip tab having positioning indicia in repeating relation therealong, a body having plural three-contact electrical connectors formed integral with said strip tab, two of said three contacts thereof being relatively spaced from each other and detached from said strip tab and bent out of the plane thereof, said third contact thereof being in the space between said two contacts and out of the plane of said two contacts and being detachably connected to said strip tab and lying in the same plane thereof, said third contact having a dimple-shaped circuit-completing means thereon to engage within and prevent relative movement between a respective connector and a printed circuit board engaged therewith, said third contact being in an aligning relation with a cooperating positioning indicia on said strip tab, whereby said strip tab facilitates the positioning of multiples of said electrical connectors and contributes to the accuracy thereof by the registry between said circuit-completing means and positioning indicia, and a mounting tab on said body extending therefrom in a direction opposite and remote from said three contacts and being movable relative thereto to mount and position said contacts at any desired angle relative to a printed circuit board.

2. The improved printed circuit electrical connectors as claimed in claim 1 wherein said positioning indicia of said strip tab are uniformly spaced openings therealong.

3. The improved printed circuit electrical connectors as claimed in claim 2 wherein each said third contact is centrally located in the space between and in relation to said two other relatively spaced contacts, and all three of said contacts are comprised of a springy metal so as to snap about opposed sides of a printed circuit board which is projected between said third contact on one side and said remaining two contacts on the opposite side.

4. The improved printed circuit electrical connectors as claimed in claim 3 wherein said detachable connection of said third contacts of said connectors with said tab strip consists of a reduced cross section at the juncture of each said third contact with said strip tab so as to facilitate the detachment of said connectors from said tab strip at said junctures.

* * * * *